United States Patent [19]
Ogura et al.

[11] Patent Number: 5,650,345
[45] Date of Patent: Jul. 22, 1997

[54] METHOD OF MAKING SELF-ALIGNED STACKED GATE EEPROM WITH IMPROVED COUPLING RATIO

[75] Inventors: Seiki Ogura, Hopewell Junction; Nivo Rovedo, Lagrangeville, both of N.Y.

[73] Assignee: International Business Machines Corporation, Armonk, N.Y.

[21] Appl. No.: 479,456

[22] Filed: Jun. 7, 1995

[51] Int. Cl.$^6$ .................................. H01L 21/8247
[52] U.S. Cl. .................................. 437/43; 437/191
[58] Field of Search .................... 437/43, 44, 191, 437/983

[56] References Cited

U.S. PATENT DOCUMENTS

| | | | |
|---|---|---|---|
| 5,063,172 | 11/1991 | Manley | 437/43 |
| 5,284,784 | 2/1994 | Manley | 437/43 |
| 5,445,984 | 8/1995 | Hong et al. | 437/191 |

*Primary Examiner*—Chandra Chaudhari
*Attorney, Agent, or Firm*—Whitham, Curtis, Whitham & McGinn; Alison Mortinger

[57] ABSTRACT

An EEPROM cell capable of being formed at high integration density achieves improved coupling ratio, reduced programming voltage and improved operating margins by provision of a dielectric on lateral sides of the floating gate and a composite control gate electrode structure having conductive sidewalls ohmically connected to a control electrode and overlapping the sides of the floating gate. A methodology for manufacture of this EEPROM cell features a plurality of self-aligned processes producing features of sub-lithographic dimensions.

4 Claims, 2 Drawing Sheets

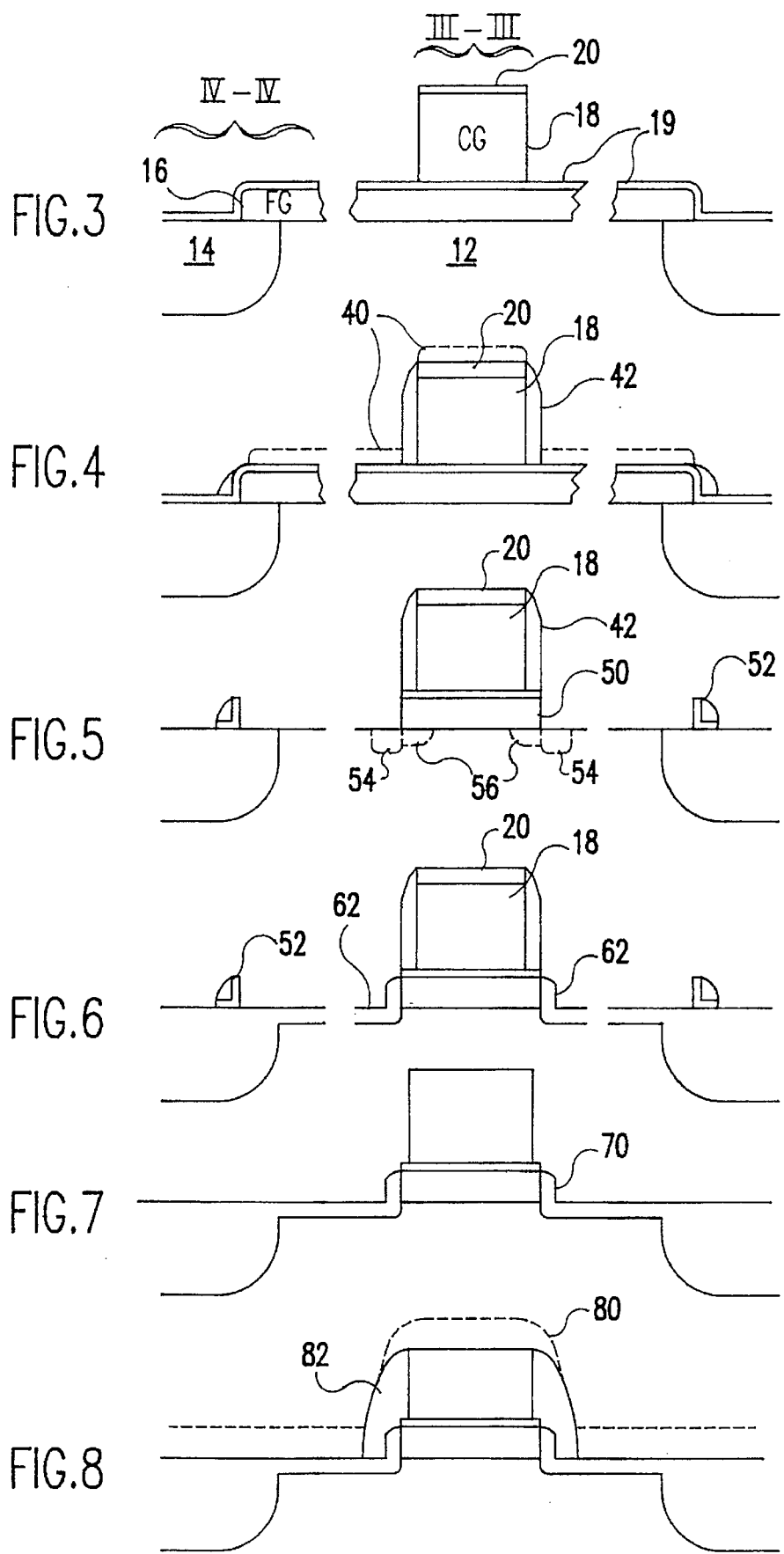

METHOD OF MAKING SELF-ALIGNED STACKED GATE EEPROM WITH IMPROVED COUPLING RATIO

BACKGROUND OF THE INVENTION

Field of the Invention

The present invention generally relates to electronic memory structures and, more particularly, to electrically erasable programmable read only memories (EEPROMs) formed at high integration density.

Description of the Prior Art

The ability to efficiently and inexpensively store binary electrical signals is central to the operation of many electrical and electronic devices, including digital data processing machines and systems, communications devices and appliances of many types. Many different types of electronic memory devices employing a wide variety of technologies have thus been developed to meet particular design needs for a wide variety of potential applications presented by designs of such devices. For example, in data processing systems, magnetic media will generally be used for mass storage, so-called read-only memory which can only be read but not written to will be used for some basic programming functions, and extremely high speed random access memory of either a dynamic or static type will be used for the working memory of the data processor. So-called cache memories of either the static or dynamic type may be used either singly or in a plurality of hierarchical levels to increase effective speed of access to mass storage.

For applications in which writing operations must be provided, such as in random access and cache memory applications, the choice between static and dynamic memories is generally a trade-off between required speed of access and required memory capacity. Static circuits provide shorter access times but carry a substantial penalty in chip space requirements for memory cells since a multi-element bistable circuit is required in each memory cell. Dynamic memory circuits are inherently somewhat slower since stored charge must be used to unbalance a sense amplifier in order to read a memory cell as well as in refresh operations. However, since data is stored as charge in a capacitor structure which constitutes the memory cell, many more memory cells can be provided on a single chip. Nevertheless, refreshing of the charge on the capacitors to compensate for leakage and other mechanisms by which stored charge may be lost also requires substantial time and increases average memory access time.

Such a trade-off is not required for read-only memory (ROM) since a memory cell can consist of a single circuit element such as a connection, fuse, diode or transistor which is selectively formed or disabled as the ROM is fabricated. On the other hand, the data stored is fixed and cannot be modified. Therefore, potential applications are generally limited to programming where identical programming will be required for a number of devices which will provide economic justification for such a custom device.

Between these technologies, a further type of memory device has been developed to provide relatively high memory capacity and high speed of access where writing may be required only once, such as for personalization of devices, or very infrequently. Such devices have been referred to as programmable read-only memories (PROMs) or, more recently, in devices which may be erased and rewritten by electrical processes only, electrically erasable programmable read only memories (EEPROMs). In recent years, writing to EEPROMs has been facilitated by provision for individual sections or partitions of the EEPROM to be erased and rewritten independently while memory is maintained in other sections. Such devices have become known as flash memories.

EEPROMs in general have many applications ranging from personalization of communications devices or storage of bar codes and the like which must respond uniquely to signals which they may receive. Flash memories provide some very valuable design advantages in many applications particularly where a large number of memory cells which can be provided on a single chip must be achieved in combination with short access time or where the limited number of devices which would require storage of identical signals does not justify custom ROM. Additionally, increased memory capacity may often reduce the frequency at which writing may be required.

The basic mechanism by which an EEPROM stores binary signals is very similar to the field-effect transistor. However, rather than providing a direct connection to a gate structure which controls the existence of a conduction channel in a semiconductor body (e.g. substrate) overlaid by the gate but insulated therefrom, a floating gate is provided which is, in turn, overlaid by but insulated from a control gate electrode.

The threshold voltage for the existence of a conduction channel in the transistor will vary depending on the charge in the floating gate. Charge may be placed on the floating gate by tunnelling or by channel hot electron injection from the substrate.

The charge movement into or out of the floating gate is achieved by an increased voltage on the control gate electrode. The magnitude of this voltage depends, in large part, on the capacitive coupling ratio (or, simply, "coupling ratio") of the device. The equivalent circuit at the control gate electrode input is essentially a capacitive voltage divider with the voltage developed across the insulator between the control gate electrode and floating gate depending on the ratio of the capacitance of the control gate and the floating gate to the sum of that capacitance and the capacitance of the floating gate and the substrate. Thus, since the capacitance of the floating gate and the semiconductor body or substrate must be optimized for the conductivity of the conduction channel, it is advantageous for the capacitance between the control gate electrode and the floating gate to be as large as possible in order to minimize the voltage required to achieve an injection effect.

Unfortunately, to achieve high integration density, the capacitive coupling between the floating gate and the control gate electrode is compromised by the reduction of area of the control gate electrode. This is particularly true of the so-called stacked gate design in which the floating gate electrode is self-aligned with the control gate which limits the area of the capacitance essentially to the area of the top surface of floating gate. Therefore, voltage for erasure and programming may be increased while breakdown voltages may be reduced, decreasing operating margins for the device.

SUMMARY OF THE INVENTION

It is therefore an object of the present invention to provide an EEPROM cell which can be formed at high integration density in a self-aligned manner but with increased coupling ratio and consequently improved operating margins.

In order to accomplish this and other objects of the invention, an integrated circuit is provided including an EEPROM cell, said EEPROM cell including a conduction channel region, a floating gate insulated from the conduction channel region, and a control gate electrode structure insulated from the conduction channel region and the floating gate and overlying top and side surfaces of the floating gate comprising a control electrode, and conductive sidewalls ohmically connected to the control electrode.

In accordance with another aspect of the invention, a method of forming an EEPROM cell in an integrated circuit including a floating gate layer, a dielectric and a control gate layer is provided including the steps of patterning at least the control gate layer in accordance with a cap formed on the control gate layer to form at least one control electrode and at least one floating gate, forming a dielectric on at least one lateral side of the floating gate, and forming at least one conductive sidewall on the control electrode ohmically connected thereto and covering the dielectric formed on the floating gate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
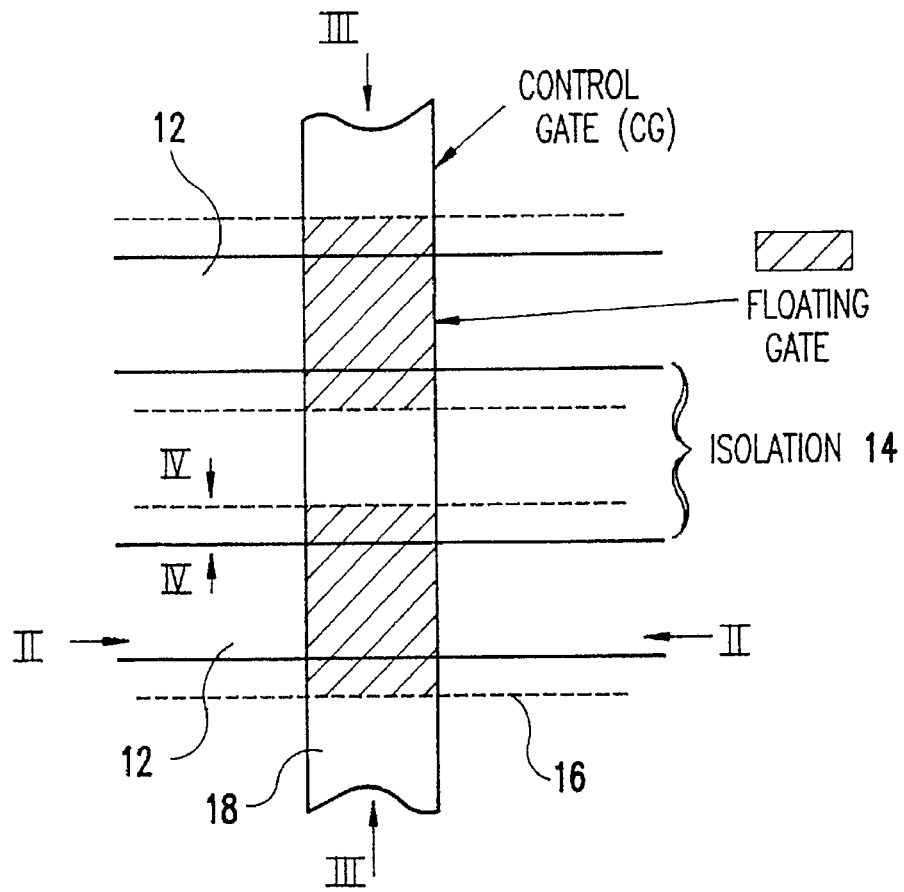
FIG. 1 is a plan view of a portion of an EEPROM in accordance with the invention.

Referring now to the drawings, and more particularly to FIG. 1, there is shown a plan view of an exemplary portion of an EEPROM in accordance with the invention. Elongated diffusion regions 12 in the semiconductor substrate or layer are separated by elongated isolation regions 14 which may be formed in any known manner such as so-called shallow trench isolation (STI) or recessed oxide isolation (ROI). Both are depicted as extending in the horizontal direction in this view. For convenience of lithographic processes, the floating gate structures, which are typically doped semiconductor, are formed over a very thin oxide insulator (not shown) in strips by known processes such as deposition of a blanket layer followed by lithographic patterning at cut edges 16 depicted by dashed lines.

Figure 2:
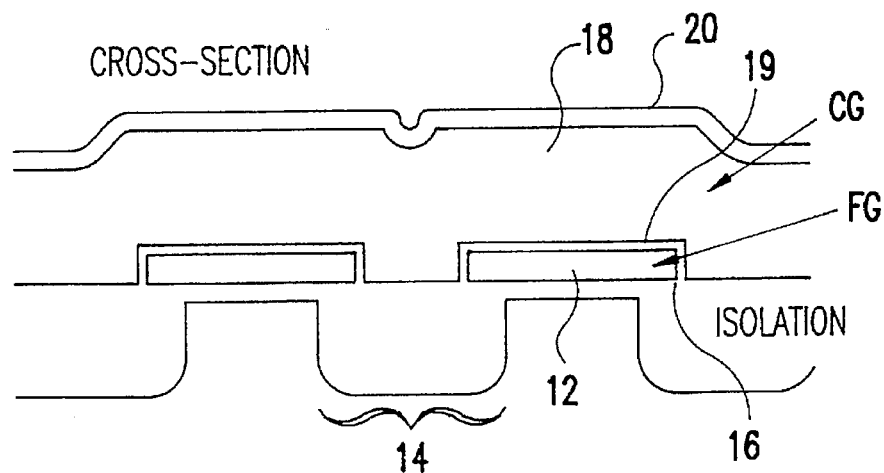
FIG. 2 is a cross-section of the EEPROM in accordance with the invention taken at III—III of FIG. 1, FIGS. 3, 4, 5, 6, 7 and 8 are cross-sections of the EEPROM in accordance with the invention taken at II—II and including a portion taken at section IV—IV of FIG. 1 illustrating a sequence of fabrication steps thereof.

The control electrode layer 18 is applied in any known manner (e.g. blanket layer deposition and patterning) in strips running in the vertical direction in this view, preferably orthogonally to the diffusion regions. The material of the control electrode 18 is not critical to the practice of the invention but, since it forms an elongated connection with a large capacitive load, it should be formed with sufficient thickness to be of very low resistance. This structure is also shown in cross-section taken along a control electrode line in FIG. 2 which also shows the interpoly dielectric 19 conventionally applied over the floating gate to insulate the floating gate from the control electrode and an oxidation barrier cap 20 including a nitride layer applied over the control electrode which is preferably patterned simultaneously with the control electrode 18.

This nitride layer of the cap 20, hereinafter sometimes referred to as a "nitride cap" or, simply "cap", is important to the formation of the EEPROM of the invention by self-aligned processes which can produce structures at sub-lithographic sizes by simplified processes. Self-aligned processes also avoid compromise of manufacturing yields by misregistration of masks and the like and do not require the design to provide space to accommodate potential inaccuracy of registration. Therefore, self-aligned processes will provide extremely high integration density with good manufacturing yield.

It should be recognized in the following description of the invention that self-aligned processes carry the same advantages of process simplification, avoidance of the need for close tolerances for alignment processes and the potential for production of device features of sub-lithographic dimensions. Because the formation of a floating gate electrode in a manner which is self-aligned to the control gate limits the coupling region to essentially the area of the top of the floating gate, the coupling ratio is thereby limited. The invention, in contrast, forms a slightly more complex control gate electrode structure, as will be discussed below, by adding extensions which are self-aligned to the upstanding feature forming the composite control/floating electrode patterned together with the nitride cap 20 (or the patterned nitride cap 20 used as a mask for patterning the control electrode 18, as may be convenient) by etching to the interpoly dielectric 19.

Referring now to FIG. 4, sidewall spacers 42, preferably of nitride, are formed on the control electrode 18 as an oxidation barrier. This formation is preferably achieved by anisotropic deposition of a blanket layer 40, shown by dashed lines, followed by an isotropic etch, such as reactive ion etching (RIE). The control electrode 18 with the remaining sidewalls now forms a mask for subsequent patterning of the floating gate (e.g. silicon) layer 16 (previously patterned into strips, as described above) into individual floating gates 50, as shown in FIG. 5, preferably by a directional etching process having two etching steps: the first etching the interpoly dielectric 19 and the second etching the floating gate layer FG. Note that the control electrode 18 is protected by the cap 20 and sidewall spacers 42. It is necessary to choose a directional etching step which does not significantly attack the nitride or other material of the cap or sidewalls or impair their ability to act as oxidation barriers because of the oxidation process which will be later carried out and discussed below in connection with FIG. 6. If necessary or desired, source and drain implantations (e.g. 54) and diffusions 56 may be done after the floating gate 50 patterning is done.

This etching process may leave an artifact 52 at the cut edge 16 (FIG. 3) of the original strip of floating gate conductor material. This artifact 52 is non-functional and does not interfere with the operation of the EEPROM cell in accordance with the invention. This artifact will be removed in the manner described below in connection with FIG. 7.

Referring now to FIG. 6, oxide 62 is then grown on exposed semiconductor, preferably silicon, including the exposed edges of the floating gate 50. The process is self-aligned and forms an interpoly dielectric on the edges of the floating gate which will be covered with conductor ohmically connected to the control electrode 18. This additional dielectric area thus provides a substantially increased capacitive coupling from the control electrode to the floating gate 16 and can be increased at will by increasing the thickness of the floating gate (i.e. increasing the lateral area thereof). Oxidation is preferred and preferably carried out in a dry atmosphere at approximately 900° C. for a few (e.g. three) minutes. Note that no growth occurs on the nitride cap 20, sidewall spacers 42 or artifact 52. The nitride or other oxidation barrier material, thus remaining exposed, is then selectively removed, preferably by etching in hot $H_3PO_4$ solution, as shown in FIG. 7.

Then, as shown in FIG. 8, conductive sidewalls 82 forming portions of the composite control gate electrode structure are formed of doped polysilicon by deposition of a sufficiently thick (e.g. in order to cover the thickness and or topography at the edge of oxide 62 where it meets and may cover the edge of the interpoly dielectric 19 between the floating gate 50 and control electrode 18) blanket layer 80 followed by anisotropic etching.

The conductive sidewall spacer 82 forms an ohmic connection with the control electrode 18 and this process is also self-aligned. This additional conductor area completes the increased capacitive coupling to the floating gate which increased the coupling ratio and avoids the problems of increased erasing and programming voltages described above. The memory cell may then be completed by application of a passivation layer, if required, and formation of source and drain connections.

Very little, if any, area penalty is involved since the sidewalls are formed by a self-aligned process and are generally of sub-lithographic dimensions, particularly when it is considered that the reduced voltages usable to induce injection allow the spacing between memory cells (e.g. the transverse dimension of the isolation regions 14) to be reduced without compromising breakdown resistance in accordance with the reduced programming voltages which can be used by virtue of the improved coupling ratio.

In view of the foregoing, it is readily appreciated that substantial increase of capacitive coupling area and improvement of coupling ratio is provided using simple and high yield processes and with little, if any, area penalty. Therefore, the invention provides an EEPROM cell which can be formed at high integration density in a self-aligned manner but with increased coupling ratio and consequently improved operating margins. It should be noted that the same principle of using the sidewalls of the floating gate can be applied to advantageously increase the coupling ratio in EEPROM cells and circuits containing them which are fabricated by other processes in addition to those described above. However, it is likely that, for example, if the control gate electrode were to be formed in a single layer, lithographic processes might be required, limiting integration density. Accordingly, the composite control gate electrode including control electrode 18 and conductive sidewalls 82 considered to be more advantageous.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of forming an EEPROM cell in an integrated circuit including a patterned floating gate layer, a dielectric layer and a control gate layer, said method including the steps of patterning said control gate layer in accordance with a cap formed on said control gate layer to form an elongated control electrode overlying a floating gate, forming a dielectric on a side of said floating gate, and forming at least one conductive sidewall on a side of said elongated control electrode and ohmically connected thereto, said at least one conductive sidewall covering said dielectric formed on said side of said floating gate.

2. A method as recited in claim 1, comprising the further steps of forming an oxidation barrier on at least one lateral side of said control electrode, and patterning said floating gate layer in accordance with said oxidation barrier.

3. A method as recited in claim 1, wherein said step of forming a dielectric includes the further step of oxidizing at least one sidewall of said floating gate.

4. A method as recited in claim 2, wherein said step of forming a dielectric includes the further step of oxidizing at least one sidewall of said floating gate.

* * * * *